United States Patent [19]

McCarty

[11] 4,357,365

[45] Nov. 2, 1982

[54] REFRACTORY METAL COATING METHOD

[75] Inventor: Lewis V. McCarty, Cleveland Heights, Ohio

[73] Assignee: General Electric Company, Schenectady, N.Y.

[21] Appl. No.: 247,902

[22] Filed: Mar. 26, 1981

Related U.S. Application Data

[63] Continuation of Ser. No. 112,925, Jan. 17, 1980, abandoned, which is a continuation-in-part of Ser. No. 937,544, Aug. 28, 1978, abandoned.

[51] Int. Cl.$^3$ .............................................. B05D 3/14
[52] U.S. Cl. .................................... 427/52; 427/251; 427/253; 427/255.1; 427/319
[58] Field of Search ................... 427/50, 52, 251, 253, 427/255.1, 319

[56] References Cited

U.S. PATENT DOCUMENTS 3,811,936  5/1974  Archer et al. ........................ 117/217
3,865,074  2/1975  Cornelissen et al. ............... 118/49.5

Primary Examiner—Bernard D. Pianalto
Attorney, Agent, or Firm—John F. McDevitt; Philip L. Schlamp

[57] ABSTRACT

A continuous wire coating method is described which features a reaction chamber wherein a volatilized refractory metal compound is thermally decomposed to deposit said refractory metal as a coating on a refractory metal wire during passage through said reaction chamber. A substantially uniform thickness coating of the refractory metal is deposited in passing the refractory metal wire through said reaction chamber in a substantially vertical direction. The nature of said coating substantially precludes any subsequent thermal migration of the refractory metal in the wire core.

4 Claims, 1 Drawing Figure

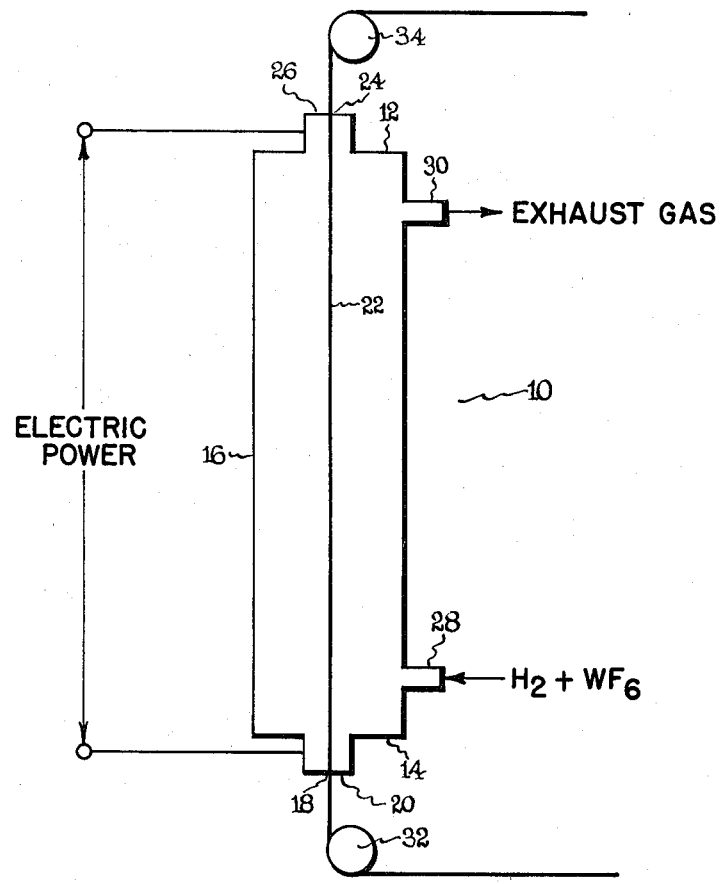

REFRACTORY METAL COATING METHOD

This is a continuation of application Ser. No. 112,925, filed Jan. 17, 1980, abandoned, which is a continuation-in-part of abandoned application Ser. No. 937,544, filed Aug. 28, 1978.

RELATED U.S. PATENT APPLICATIONS

The refractory metal coatings which are obtained in the present apparatus are already described in U.S. Pat. Appln. Ser. No. 937,545, filed Aug. 28, 1978, in the names of Lewis V. McCarty and John W. Pugh, and assigned to the assignee of the present invention. Consequently, the present invention represents an improved method of using a particular coating apparatus wherein these coatings are obtained in an efficient and convenient manner.

BACKGROUND OF THE INVENTION

Electrodeposition has long been known as a means to provide a refractory metal coating on various refractory metal substrates including wire. It is also well-known to deposit various metal coatings including refractory metals on refractory metal substrates from liquid suspensions which are thereafter heated to sinter the refractory metal constituents. It is also known to insulate electromagnetic wire continuously in a wire coating apparatus utilizing a vertically oriented heating chamber to produce a solid coating of substantially uniform thickness around the electromagnetic wire.

SUMMARY OF THE INVENTION

It has now been discovered that a substantially uniform thickness coating of various refractory metals can be deposited continuously on a length of refractory metal wire in an enclosed reaction chamber wherein such deposition is produced by thermal decomposition of a gaseous reactant containing the refractory metal to be deposited. Specifically, said coating apparatus comprises an enclosed reaction chamber which includes associated means to continuously feed the wire in a substantially vertical direction through the reaction chamber, electrically conductive seal means located at the entrance and exit apertures of the reaction chamber to complete an electrical circuit with the wire during its entire residence in the reaction chamber, means to introduce a volatilized refractory metal compound which can be thermally decomposed to the bottom of said reaction chamber, and means to exhaust gaseous reaction products from the top of said reaction chamber after a uniform refractory metal coating has been deposited on the wire. In a preferred construction, said coating apparatus has a tubular form wherein the refractory metal wire is drawn continuously and vertically through the center of said chamber. The only heating in said reaction chamber is furnished by electrical resistance heating of the refractory metal wire and the heated refractory metal wire is protected from oxidation by the gaseous reactant. It is a general object of the present invention, therefore, to provide a continuous coating apparatus which conveniently and efficiently deposits a uniform coating of various refractory metals, especially tantalum and tungsten on a refractory metal wire and which can have the same metal composition as the metal being deposited.

The improved coating method which is carried out in the above described apparatus according to the present invention comprises:

(a) continuously moving a refractory metal wire at a predetermined speed upwardly through an enclosed reaction chamber in a substantially vertical direction, (b) heating said refractory metal wire during passage through said reaction chamber utilizing electrical energy supplied with mercury electrical contacts located at both bottom and top apertures in said reaction chamber, (c) continuously introducing a volatilized refractory metal compound to the bottom of said reaction chamber which undergoes thermal diffusion separation therein so that flow in a downward direction takes place and said compound undergoes substantially quantitative conversion to avoid side reactions at the top aperture in said reaction chamber, and (d) continuously exhausting the reaction product formed in said reaction chamber while depositing a refractory metal coating of substantially even thickness around the refractory metal wire.

A further object of the present invention is to provide a continuous coating method wherein the coating process takes place without need for additional control means.

These objects and others will become apparent from the following detailed description of operating a continuous coating apparatus to deposit a barrier layer coating of tungsten or tantalum on a bare molybdenum wire.

DESCRIPTION OF THE FIGURE

The accompanying drawing is a schematic view of the present coating apparatus.

DESCRIPTION OF THE PREFERRED EMBODIMENTS

Referring to the accompanying drawing, an enclosed reaction chamber 10 is shown which includes top and bottom cover means 12 and 14, respectively, being separated by wall enclosure 16. An entrance aperture 18 is provided in the bottom cover member 14 and with said entrance aperture further including electrically conductive seal means 20 to provide an electrical contact with the length of refractory metal wire 22 being drawn through said reaction chamber. Correspondingly, top cover means 12 is provided with an exit aperture 24 which includes electrically conductive seal means 26 being operatively associated therewith to permit an electrically resistive heating path to be generated in molybdenum wire element 22 during its entire passage through said reaction chamber. In said preferred embodiment, the combined sealing and electrical contact means 20 and 26 is formed with fluorocarbon polymer bushings having a perforated tungsten disc at one end of each bushing to physically support a drop of mercury making electrical contact to the molybdenum wire. Electrical insulation of said means from the stainless steel construction of the reaction chamber is thereby provided by the fluorocarbon polymer material. A separate opening 28 is provided at the bottom end of said tubular reaction chamber to introduce the gaseous reactant in the form of a mixture of the selected refractory metal compound with hydrogen gas at a suitable flow rate for the desired coating thickness. An exhaust opening 30 located at the top end of said tubular reaction chamber permits continuous removal of the reaction products formed upon thermal decomposition. Thermal decomposition of the specific reaction mixture shown in the accompanying drawing involves chemical reaction of hydrogen with a volatile refractory metal fluoride compound to produce gaseous hydrogen fluoride. A suitable electric power source (not shown) when connected to the electrical contacts of the seal members 20 and 26 furnishes all the heating needed for said chemical reaction. The pulley 32 of a conventional wire reel mechanism located at the bottom end of said reaction chamber provides continuous movement of the heated wire through the reaction chamber at a predetermined speed. Correspondingly, the pulley 34 of a take-up reel mechanism located at the top end of said reaction chamber cooperates in coiling the refractory metal coated molybdenum wire upon exit from the reaction chamber.

In operation, chemical vapor deposition of a tungsten coating from tungsten hexafluoride and hydrogen is carried out in the above described apparatus. Tungsten hexafluoride is sufficiently volatile at room temperature that when mixed with hydrogen and heated, thermal decomposition of said mixture commmences below 400° C. and said chemical reaction becomes quite rapid about 600° C. The deposit nucleates quite uniformly on the bare molybdenum wire substrate to form a dense deposit adequate to preclude any significant thermal diffusion of the underlying molybdenum material through the coating if the coated wire is thereafter heated. Deposition can be carried out by initially adjusting the wire temperature in pure hydrogen to a temperature between 600°–700° C. followed by introduction of the reaction mixture at a uniform flow rate while the heated wire is being drawn at a particular speed through the reaction chamber. Accordingly, the coating thickness is determined by the speed of wire and the amount of gaseous reactant being introduced to the reaction chamber so that further controls on the deposition process are unnecessary. Said deposition process has also been observed to effect a substantially quantitative conversion of the tungsten hexafluoride thereby avoiding undesired side reaction at the exit seal means of the reaction chamber. It has also been observed that a temperature gradient exists in the vertically travelling wire such that the lower part of the wire in the reaction chamber is cooler where the deposition first takes place. This effect produces a fine grain nucleation thereby enhancing uniformity of the final coating deposit. A still further advantage from vertical travel of the wire during the coating process is thermal diffusion separation of tungsten hexafluoride from hydrogen in the reaction chamber. The further effect causes tungsten hexafluoride to flow downwardly at the cooler stainless steel walls of the reaction chamber for mixture with the incoming reaction mixture and more complete reaction in the reaction chamber.

The improved method of the present invention avoids drawbacks ordinarily encountered when mercury electrical contacts are employed in the coating apparatus. Interaction between mercury and the volatized refractory metal compound has previously been found to produce byproducts interfering with deposition of a uniform thickness refractory metal coating on the heated wire. This problem is experienced most severely at the bottom exit aperture in the conventional coating apparatus wherein both the refractory metal compound and refractory metal wire are introduced at the upper entrance aperture in said apparatus. Avoidance of said problem is accomplished in the present method by introducing both components at the bottom end of the modified coating apparatus and providing thermal diffusion separation along with substantially quantitative conversion of the volatilized reactant before encountering the top exit aperture in said modified apparatus. Another drawback said to be attributable to use of mercury electrical contacts in the conventional coating apparatus is deposition of mercury on the refractory metal wire which also interfers with a uniform deposition of a refractory metal coating on the heated wire. Surprisingly, such mercury pickup is not encountered in the present method to any great extent and which may be due to avoiding undesirable interaction between mercury and the volatilized refractory metal compound in the modified coating apparatus.

It will be apparent from the foregoing description that a generally useful wire coating method has been disclosed for deposition of a refractory metal coating on a refractory metal wire. It will be apparent that modifications of said method than above specifically disclosed are possible, however, without departing from the spirit and scope of the present invention. For example, tantalum coatings in said apparatus are contemplated but which may further require auxiliary heating of the reaction chamber because of generally higher volatilization temperatures. Thermal decomposition of tantalum pentachloride in said apparatus also does not require that any hydrogen be present in the gaseous reactant. It is intended to limit the present invention, therefore, only by the scope of the following claims.

What I claim as new and desired to secure by United States Letters Patent is:

1. An improved coating method to deposit a refractory metal continuously on a length of refractory metal wire which comprises:
    (a) continuously moving a refractory metal wire at a predetermined speed upwardly through an enclosed unheated reaction chamber in a substantially vertical direction,
    (b) heating said refractory metal wire during passage through said reaction chamber utilizing electrical energy supplied with mercury electrical contacts located at both bottom and top apertures in said reaction chamber,
    (c) continuously introducing a volatilized refractory metal compound to the bottom of said reaction chamber which undergoes thermal diffusion separation therein so that flow in the downward direction takes place and said compound undergoes substantially quantitative conversion to avoid side reactions at the top aperture in said reaction chamber,
    (d) maintaining a temperature gradient along the vertically moving refractory metal wire so that the lower part of the said wire in the reaction chamber is cooler where deposition first takes place and produces fine grain nucleation in the initial coating, and
    (e) continuously exhausting the reaction products formed in said reaction chamber while depositing a refractory metal coating of substantially even thickness around the refractory metal wire.

2. A coating method as in claim 1 wherein the volatilized refractory metal compound is introduced to the reaction chamber as a mixture with hydrogen.

3. A coating method as in claim 1 which employs auxiliary heating means to maintain a predetermined elevated temperature in said reaction chamber.

4. A coating method as in claim 1 wherein the coating thickness is determined by the speed of the wire and the amount of volatilized refractory metal compound introduced to the reaction chamber.

* * * * *